(12) United States Patent
Hioki

(10) Patent No.: US 6,683,602 B1
(45) Date of Patent: Jan. 27, 2004

(54) DISPLAY CONTROL APPARATUS AND ELECTRONIC APPLIANCE

(75) Inventor: Osamu Hioki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 270 days.

(21) Appl. No.: 09/721,732

(22) Filed: Nov. 27, 2000

(30) Foreign Application Priority Data

Nov. 30, 1999 (JP) .............................. 11-340925
Aug. 28, 2000 (JP) ........................ 2000-256589

(51) Int. Cl.[7] .............................................. G06F 15/76
(52) U.S. Cl. .......................... 345/204; 345/98; 345/99; 345/100; 345/104; 714/5; 714/6; 714/7; 349/139; 349/143
(58) Field of Search .................................. 345/204, 531, 345/536, 537, 538, 98, 99, 100, 104; 714/5, 6, 7; 349/139, 143

(56) References Cited

U.S. PATENT DOCUMENTS

| | | | | |
|---|---|---|---|---|
| 4,156,798 A | * | 5/1979 | Doelz .............................. 178/3 |
| 4,363,108 A | * | 12/1982 | Lange et al. ................. 345/467 |
| 4,980,765 A | * | 12/1990 | Kudo et al. .................. 345/547 |
| 5,956,286 A | * | 9/1999 | Lattimore et al. ...... 365/230.05 |
| 6,175,533 B1 | * | 1/2001 | Lee et al. ..................... 365/154 |
| 6,288,728 B1 | * | 9/2001 | Satoh et al. ................. 345/519 |
| 6,343,161 B2 | * | 1/2002 | Uchida ......................... 382/309 |
| 6,424,658 B1 | * | 7/2002 | Mathur ......................... 370/429 |
| 6,519,672 B2 | * | 2/2003 | Scardamalia et al. ........ 710/317 |

* cited by examiner

Primary Examiner—Richard Hjerpe
Assistant Examiner—Abbas Abdulselam
(74) Attorney, Agent, or Firm—Oliff & Berridge, PLC

(57) ABSTRACT

A segment terminal is structured to function as a data input terminal and a data output terminal in a manner that they can be switched from one to the other, and a memory cell formed from a two-port memory is provided with a port, through which data stored in the memory is read and outputted to the segment terminal, that is structured to function as a port for reading stored data and writing data. In a test mode, test data is supplied to the segment terminal, and the test data is written in the memory cell through the port through which data stored in the memory is read and outputted to the segment terminal. The segment terminal is provided for each of the columns or rows of a dot matrix. Test data is written in the memory cells in each of the columns or rows through switching the memory cells in which the test data is to be written. As a result, the test data is written in the memory cells in the unit of the number of the segment terminals, and therefore, the time for writing the test data is shortened.

5 Claims, 5 Drawing Sheets

DISPLAY CONTROL APPARATUS AND ELECTRONIC APPLIANCE

BACKGROUND OF THE INVENTION

1. Field of Invention

The present invention relates to a display control apparatus such as an LCD driver IC that controls display of a display apparatus such as an LCD (Liquid Crystal Display), and to an electronic appliance that is equipped with such a display control apparatus.

2. Description of Related Art

In general, as shown in FIG. 6 for example, an LCD driver which controls the display of an LCD (not shown) has a plurality of memory cells MS, each being composed of a two-port memory, disposed in a manner corresponding to a dot matrix of the LCD. The memory cell MS has, for example, two inverters I1 and I2, two transistors T1 and T2 for data writing via a first port, and a three-state inverter I3 for data reading via a second port. Display data for the LCD from a controller 10 is written in the memory cells MS. The three-state inverter I3 is controlled according to a timing signal from a timing signal generation circuit 12 to successively read out data stored in the memory cells MS and output the data through a buffer BF from a segment terminal to the LCD.

When the LCD driver is shipped out from the factory, an operation test for the LCD driver is conducted. For confirmation of the operation of the LCD driver, display data as well as prescribed test data are written in each of the memory cells MS, the stored data is successively read out from the memory cells MS through the second ports, and the data is retrieved and observed by a test probe that is connected to the segment terminal.

SUMMARY OF THE INVENTION

In general, data from the controller 10 is written in the memory cells MS by designating addresses of the memory cells MS through a bus. Normally, the bus is generally a four-bit bus or an eight-bit bus, and therefore, the number of the memory, cells that can be written with one writing operation is limited. Accordingly, writing operations need to be repeated in order to write the data in the entire memory cells MS. Such operations may be enough to meet the requirements of the user and thus may not present any problem, after the LCD driver is shipped out and used by the user. However, during the operation test to be conducted before shipping out, it may take a substantial amount of time just to perform an operation to write test data in the memory cells MS, thereby obstructing the effort to shorten the time for the test.

Also, typically, a test pattern is created through performing a logic simulation and confirming its operation. Therefore, there may be problems in that it may take a substantial amount of time to create a test pattern to be written in the entire memory cells MS, since such test pattern amounts to a substantial length. It also may take an enormous amount of time to perform the logic simulation.

It is an object of the present invention to at least provide a display control apparatus, such as an LCD driver and the like, that can shorten the time required for its operational tests and to provide an electronic appliance that is equipped with the display control apparatus.

A display control apparatus in accordance with an exemplary embodiment of the present invention may consist of a storage region composed of a two-port memory in which display data is written via a first port and the display data is read via a second port, and outputted through a display apparatus terminal to a display apparatus. In the display control apparatus of this exemplary embodiment, the display apparatus terminal is structured to be able to switch between a state for data input and a state for data output. Data-writing in the storage region through the second port and data-reading from the storage region through the second port can be mutually switched. Data to be inputted in the display apparatus terminal can be written in the storage region via the second port.

In the exemplary embodiment of the present invention set forth above, display data is written in the memory region composed of a two-port memory, and the data in the storage section is read via the second port, and outputted from the display apparatus terminal to a display apparatus such as an LCD. In this exemplary embodiment, the display control apparatus is structured such that the display apparatus terminal can be switched between a state for data input and a state for data output, data-writing in the storage region through the second port and data-reading from the storage region through the second port can be switched with one another, and data to be inputted in the display apparatus terminal can be written in the storage region via the second port.

It is noted that data for a display control apparatus for an LCD or the like is written in a storage region such as a RAM through a bus. In this case, the storage region that can be written with one writing operation is limited. Accordingly, writing operations need to be repeated in order to write the data in the entire storage region. Such operations may not present any problem when the display control apparatus is operated under a normal use condition. However, during the operation test to be conducted before shipping out, it may take a substantial amount of time just to write the test data in the storage region.

However, the display apparatus terminal is switched to a state that allows data input, and the second port is switched to a state that allows data-writing through the second port to the storage region, to thereby switch to a state that allows writing input data to the display apparatus terminal into the storage region. As a result, under the above-described condition, when test data is inputted in the display apparatus terminal, the test data is written in the storage region. As a consequence, the test data is written in the storage region in the unit of the number of the display apparatus terminals. This may shorten the time for writing test data in the storage region compared to the case in which test data is written in the storage region through a bus, and thus may shorten the processing time required for the test.

In another exemplary embodiment, in the display control apparatus, the storage region may consist of a plurality of memory cells, and data can be written in each of the memory cells via the single display apparatus terminal.

In the display control apparatus of this exemplary embodiment, data can be written in each of the plurality of the memory cells via the single display apparatus terminal. As a result, the display apparatus terminal does not need to be provided in each of the memory cells.

In another exemplary embodiment, in the display control apparatus, a plurality of the display apparatus terminals are provided.

In the display control apparatus of this exemplary embodiment, the plurality of display apparatus terminals are provided and data are written through the plurality of display apparatus terminals. Accordingly, data can be simultaneously written in the plurality of memory cells that compose the storage region.

In another exemplary embodiment, the display control apparatus is used as a display control apparatus for an electronic appliance.

Furthermore, an electronic appliance in accordance with an exemplary embodiment of the present invention is equipped with the display control apparatus according to the various exemplary embodiments discussed above.

DETAILED DESCRIPTION OF PREFERRED EMBODIMENTS

Exemplary embodiments of the present invention are described with reference to the accompanying drawings.

Figure 1:
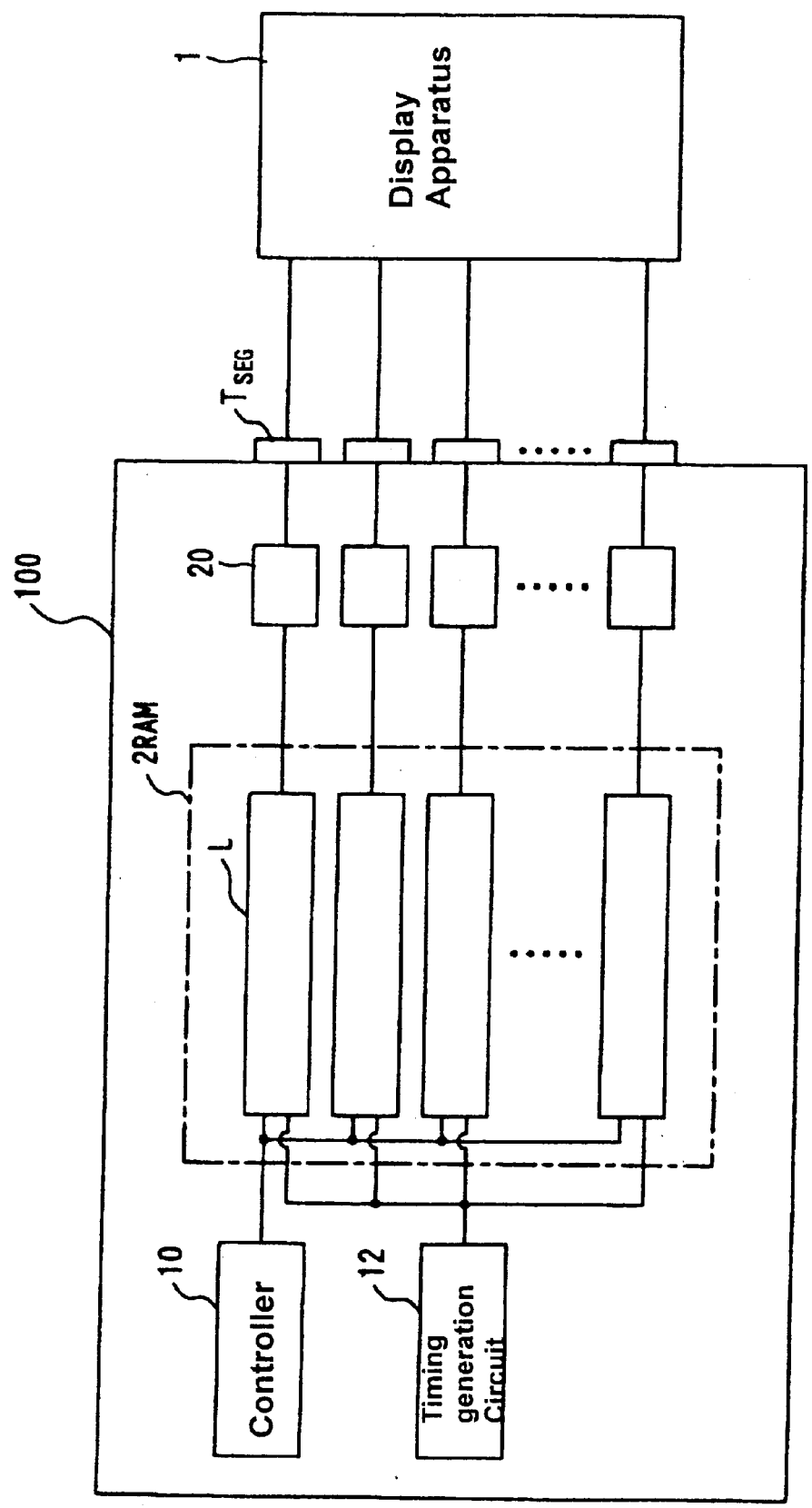
FIG. 1 schematically shows a structure of a display control apparatus in accordance with one exemplary embodiment of the present invention.

FIG. 1 schematically shows a display control apparatus in accordance with one exemplary embodiment of the present invention, for example, an LCD driver IC.

As shown in FIG. 1, a display control apparatus 100 includes a RAM 2 in which a plurality of memory cells MS (FIG. 2) in a plurality of memory cell columns L are connected to word lines and bit lines corresponding to a dot matrix of a display apparatus 1 such as an LCD, disposed in a similar manner as a known RAM. The display control apparatus 100 also includes an input/output switching circuit 20 provided for each lateral column of the memory cells MS, a controller 10 that controls writing and reading of data on each of the memory cells MS in the RAM 2, and a timing generation circuit 12 that switches among the memory cells MS in each memory cell column L that are arranged in a lateral direction, such that any one of the memory cells MS in the memory cell column L becomes conductive with the corresponding input/output switching circuit 20. The input/output switching circuit 20 is connected to an individual segment terminal (i.e., display apparatus terminal) $T_{SEG}$. In other words, data stored in the memory cells MS in the RAM 2, which belong to one lateral memory cell column, are outputted through the same input/output switching circuit 20 and the segment terminal $T_{SEG}$.

Figure 2:
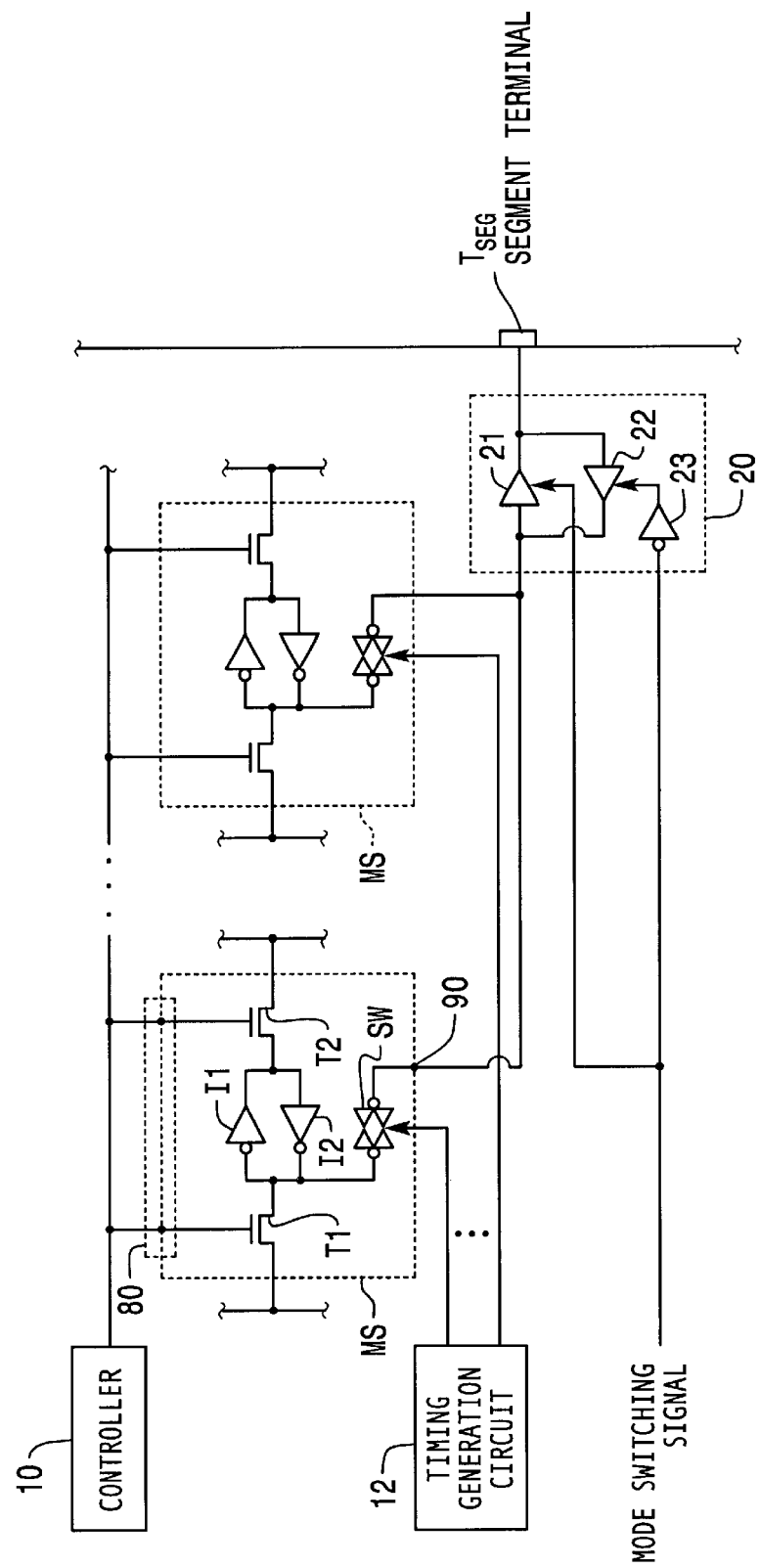
FIG. 2 shows a structure of a portion in detail of the display control apparatus shown in FIG. 1.

As shown in FIG. 2, each of the memory cells MS is formed from a two-port memory. The memory cell MS is formed from, for example, two inverters I1 and I2 in mutually inverse directions that are connected in parallel with each other, two transistors T1 and T2 for controlling the data-writing operation via a first port 80 of the memory cell MS, and a bi-directional switch SW formed from a transmission gate and the like for controlling data-reading and data-writing via a second port 90. The bi-directional switch SW is connected to a segment terminal $T_{SEG}$ through the input/output switching circuit 20.

The transistors T1 and T2 are controlled by the controller 10, and a timing signal from the timing generation circuit 12 is inputted in a control signal input terminal of the bi-directional switch SW.

The controller 10 controls word lines and bit lines by a known process to control the transistors T1 and T2 of each of the memory cells MS to thereby control writing and reading data in and from each of the memory cells MS, whereby specified display data provided by an upper-level computer (not shown) is written in a specified one of the memory cells MS.

The timing generation circuit 12 successively turns on the bi-directional switches SW of the memory cells MS in each of the memory cell columns L at a predetermined timing by a time sharing method. In other words, the timing generation circuit 12 turns on the bi-directional switches SW of the memory cells MS such that any one of the plurality memory cells MS in the memory cell column L is successively placed in a conductive state with the input/output switching circuit 20. As a result, data stored in the memory cells MS are successively outputted to the input/output switching circuit 20, and data from the input/output switching circuit 20 is written in the memory cells MS.

The input/output switching circuit 20 is formed from an output three-state circuit 21 and an input three-state circuit 22 in mutually inverse directions that are connected in parallel with each other. A mode-switching signal from the upper-level computer (not shown) or the like is inputted in a control signal input terminal of the output three-state circuit 21. The mode-switching signal is inverted by an inverter 23 and then inputted in a control signal input terminal of the input three-state circuit 22. Depending on the mode-switching signal, the output three-state circuit 21 or the input three-state circuit 22 becomes effective to operate as an output circuit that outputs a signal to the segment terminal $T_{SEG}$ or to operate as an input circuit that inputs a signal from the segment terminal $T_{SEG}$, respectively.

Figure 3:
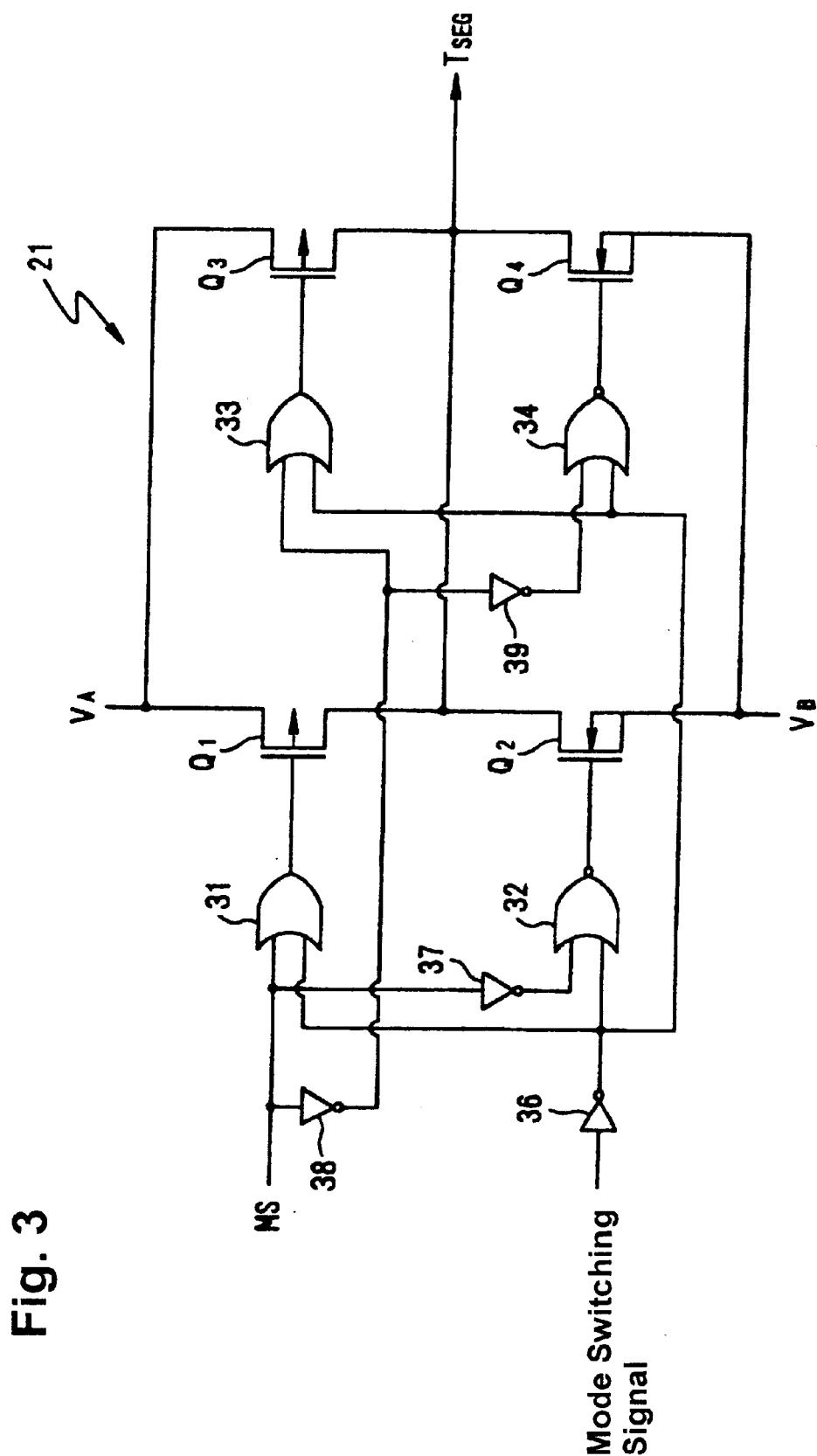
FIG. 3 shows a structure of an input/output switching circuit in detail.

Also, the output three-state circuit 21 is structured in a manner as shown in FIG. 3, for example, for controlling its output in a high impedance state in a test mode. For example, the output three-state circuit 21 includes serially connected p-channel type FET $Q_1$ and n-channel type FET $Q_2$, and serially connected p-channel type FET $Q_3$ and n-channel type FET $Q_4$, that are connected in parallel with each other between a power supply sources $V_A$ and $V_B$. OR circuits 31–34 control the FET $Q_1$–FET $Q_4$.

For example, an output from the memory cell MS and an inverted signal that is obtained by inverting the mode-switching signal by the inverter 36 are inputted in the OR circuit 31, and an output from the OR circuit 31 is inputted in a gate terminal of the FET $Q_1$. An inverted signal that is obtained by inverting the output from the memory cell MS by an inverter 37 and an inverted signal that is obtained by inverting the mode-switching signal are inputted in the OR circuit 32, and an output from the OR circuit 32 is inputted in a gate terminal of the FET $Q_2$. An inverted signal that is obtained by inverting the output from the memory cell MS by an inverter 38 and an inverted signal that is obtained by inverting the mode-switching signal are inputted in the OR circuit 33, and an output from the OR circuit 33 is inputted in a gate terminal of the FET $Q_3$. An inverted signal that is obtained by further inverting the inverted signal of the memory cell MS by an inverter 39 and an inverted signal that is obtained by inverting the mode-switching signal are inputted in the OR circuit 34, and an output from the OR circuit 34 is inputted in a gate terminal of the FET $Q_4$.

Therefore, when the mode-switching signal is set to an "L" level that indicates a test mode, the mode-switching signal is inverted by the inverter 36 and provided to the OR circuits 31–34. As a result, without regard to the output signal from the memory cell MS, the OR circuit 31 provides an output at an "H" level, the OR circuit 32 provides an inverted output at an "L" level, the OR circuit 33 provides an output at an "H" level, and the OR circuit 34 provides an inverted output at an "L" level, such that the FETs $Q_1$–$Q_4$ are placed in a non-conductive state. In other words, the power is not supplied, and the output is placed in a high impedance state. On the other hand, when the mode-switching signal is set to an "H" level that indicates a normal mode, the mode-switching signal is inverted by the inverter 36 and provided to the OR circuits 31–34. As a result, the OR circuits 31 and 33 provide outputs and the OR circuits 32 and 34 provide inverted outputs according to the output signal from the memory cell MS. Therefore, the FETs $Q_1$–$Q_4$ operate according to the output signal from the memory cell MS, and can provide output signals according to the output from the memory cell MS.

An operation of the above-described exemplary embodiment is described below.

When display data is outputted to the display apparatus 1 such as an LCD, the mode-switching signal is set to an "H" level that indicates the normal mode. As a result, the output three-state circuit 21 of the input/output switching circuit 20 turns to an ON state, and the input three-state circuit 22 turns to an OFF state, whereby the input/output switching circuit 20 functions as an output circuit that outputs data stored in the memory cell MS to the segment terminal $T_{SEG}$.

When the controller 10 is operated in the state described above, the word lines and the bit lines are controlled in a manner similar to the known method, and the specified display data is written in the memory cells MS.

On the other hand, the timing generation circuit 12 turns on and off the bi-directional switches SW of the memory cells MS in each of the memory cell columns L at a specified timing.

As a result, the bi-directional switches SW in each of the memory cell columns L are successively placed in an ON state, and therefore the data stored in the memory cells MS is outputted to the input/output switching circuit 20 through the bi-directional switches SW. At this moment, the output three-state circuit 21 is effective, and therefore the data is outputted to the segment terminal $T_{SEG}$ through the output three-state circuit 21. Data in the memory cells MS in each of the memory cell columns L are successively read out and outputted from the segment terminal $T_{SEG}$ of the corresponding memory cell L, whereby the specified display data is displayed on the display apparatus 1 such as an LCD.

On the other hand, when the LCD driver is tested, the mode-switching signal is set at an "L" level that indicates a test mode. As a result, a control signal at an "L" level is inputted in the output three-state circuit 21 of the input/output switching circuit 20, and a control signal at an "H" level is inputted in the input three-state circuit 22. Consequently, the input three-state circuit 22 becomes effective, whereby the input/output switching circuit 20 functions as an input circuit that provides data inputted in the segment terminal $T_{SEG}$ to the bi-directional switch SW.

In the state described above, test data is supplied to the segment terminal $T_{SEG}$ that is provided for each of the memory cell columns L, and a timing signal is provided by the timing generation circuit 12 to successively turn on the bi-directional switches SW of the respective memory cells MS.

As a result, the test data is transferred from the segment terminal $T_{SEG}$ through the input three-state circuit 22 to the bi-directional switches SW of the respective memory cells MS. The test data is passed through the bi-directional switches SW and written in the memory cells MS when the bi-directional switches SW are turned on.

After the test data is written in the respective memory cells MS, the mode-switching signal is changed to the one in a normal mode, and the input/output switching circuit 20 is switched to operate as an output circuit. Then, a test probe is connected to each of the segment terminals $T_{SEG}$. Then, for example, the timing generation circuit 12 is activated and output signals from the segment terminals $T_{SEG}$ are observed, whereby tests are conducted to confirm operations such as timing of the timing generation circuit 12 and operations of the bi-directional switches SW.

In this manner, each of the segment terminals $T_{SEG}$ is provided for each of the columns of the dot matrix formed by the memory cells MS, and test data is written through the segment terminals $T_{SEG}$. Accordingly, test data is written in the memory cells MS in the unit of the number of columns of the dot matrix.

If data is inputted from the controller 10 and written in the memory cells MS, such data is written through a generally 4-bit bus or an 8-bit bus. Accordingly, the number of the memory cells MS that can be written at one time is limited, and therefore writing operations need to be repeated to write data in the entire memory cells MS.

In contrast, in accordance with the exemplary embodiment described above, data can be simultaneously written in the memory cells MS that correspond to the respective segment terminals $T_{SEG}$ Therefore data can be written in the memory cells MS in the unit of the number of the segment terminals $T_{SEG}$.

Accordingly, test data can be written in the memory cells MS in a substantially shorter time compared to the case in which the test data is provided from the controller 10 and written in the memory cells MS.

Also, a conventional LCD driver may be simply provided with a structure in which data inputted in a segment terminal $T_{SEG}$ can be written in memory cells MS. Accordingly, a LCD driver in accordance with the present exemplary embodiment can be realized without making substantial changes to the conventional LCD driver.

Furthermore, a test pattern is much shorter than the conventional test pattern, and therefore the time required for forming a test pattern can be substantially shortened, and the time required for executing a logic simulation is also substantially shortened.

Also, in accordance with the exemplary embodiment described above, when test data is written, the timing generation circuit 12 successively places the bi-directional switches SW of the respective memory cells MS in an ON state. Therefore, test data can be written in the memory cells MS without changing the specification of the timing generation circuit 12. Alternatively, however, when test data is written in the memory cells MS, the timing generation circuit 12 may simultaneously turn on the bi-directional switches SW, and the same test data can be written in the memory cells that belong to the same segment terminal $T_{SEG}$. As a result, the time for writing data in the memory cells MS can be further shortened.

It is noted that, in accordance with the exemplary embodiment described above, the memory cells MS arranged in line in a width direction is defined as a memory cell column L, and data is written in the memory cells MS in the unit of the memory cell column L. However, the present invention is not limited to such an embodiment. Instead, the memory cells MS arranged in line in a length direction may be defined as a unit, and data may be written in the unit of the memory cell column in the length direction.

Also, in the exemplary embodiment described above, the input/output switching circuit 20 and the segment terminal $T_{SEG}$ are provided for each of the memory cell columns. However, one input/output switching circuit 20 and one segment terminal $T_{SEG}$ can be provided for a plurality of memory cell columns. In this case, the word lines and the bit lines may be controlled and the bi-directional switches SW may be turned on and off by the controller 10 and the timing generation circuit 12 in a manner that only data stored in any one of the plurality of the memory cells MS that are connected to the common input/output switching circuit 20 is outputted to the common input/output switching circuit 20.

Also, in the exemplary embodiment described above, segment terminals are used as the display apparatus terminals. However, the present invention is not limited to such an embodiment. For example, terminals of data lines and terminals of scanning lines can be used instead.

Also, in the exemplary embodiment described above, the memory cells MS are composed of CMOSs. However, the present invention is not limited to such an embodiment. For example, TTL memory cells, flash memories, and other rewritable memories such as EEPROMs are also applicable as long as each of them are formed with two ports.

Also, in the exemplary embodiment described above, a transmission gate is used as the bi-directional switch SW. However, the present invention is not limited to such an embodiment, and any device that can control switching on and off in both directions can be used. For example, two three-state circuits may be combined in a similar manner as the input/output switching circuit 20.

Also, the exemplary embodiment described above is applied to a LCD driver for a liquid crystal display. However, the present invention is also applicable to any driver that uses RAMs formed from two-port memories and can read data stored in the two-port memories without using a bus and output the data to a display apparatus.

Also, the liquid crystal display includes a liquid crystal display of an active matrix type such as a TFT (Thin Film Transistor) type and a TFD (Thin Film Diode) type, and a liquid crystal display of a passive matrix type such as a STN-LCD (Super Twisted Nematic-LCD). The present invention is also applicable to an organic type EL display, a field emission diode (FED) panel, a plasma display (PDP) panel, and other displays using flat fluorescent lamps.

Also, in the exemplary embodiment described above, the invention is applied to a black-and-white LCD driver. However, the present invention is not limited to such an embodiment, and is also applicable to a LCD driver for a LCD that is capable of half-tone display.

Also, the display control apparatus described above is also applicable to, for example, a hand-carry type terminal with a cellular communication function, a PAD, a cellular phone, and other electronic appliances such as digital cameras.

Figure 4:
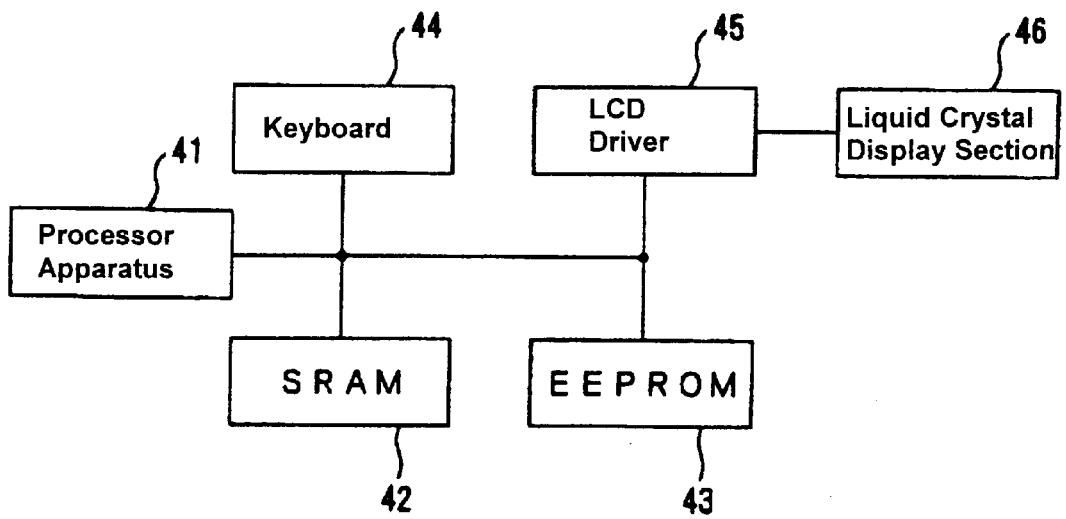
FIG. 4 shows a structure of a system of a cellular phone.

FIG. 4 shows a block diagram in part of a system in which the display control apparatus described above is implemented in a cellular phone. An arithmetic processor apparatus 41 connects to an SRAM 42, an EEPROM 43, a keyboard 44 and an LCD driver 45 composed of the display control apparatus 100 described above. The LCD driver 45 is connected to a liquid crystal display section 46 by a bus.

Figure 5:
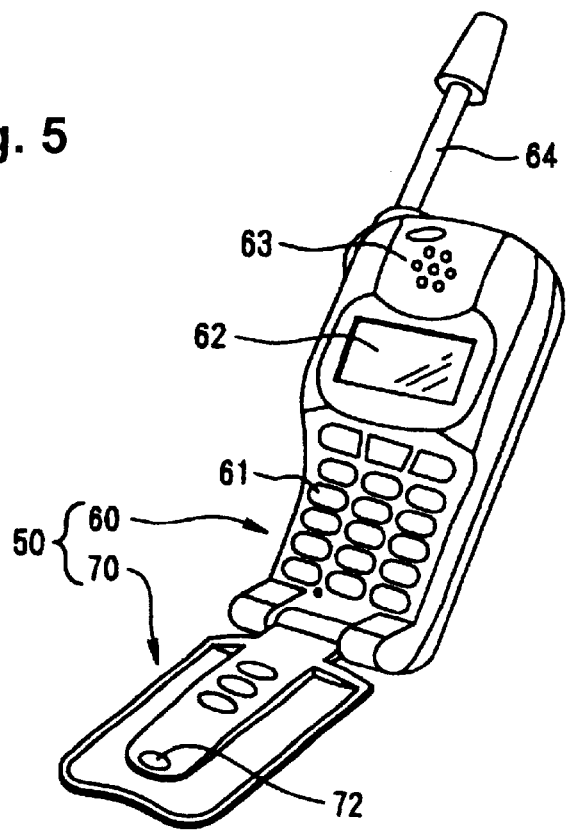
FIG. 5 shows a perspective view of a cellular phone equipped with the system shown in FIG. 4.
Figure 6:
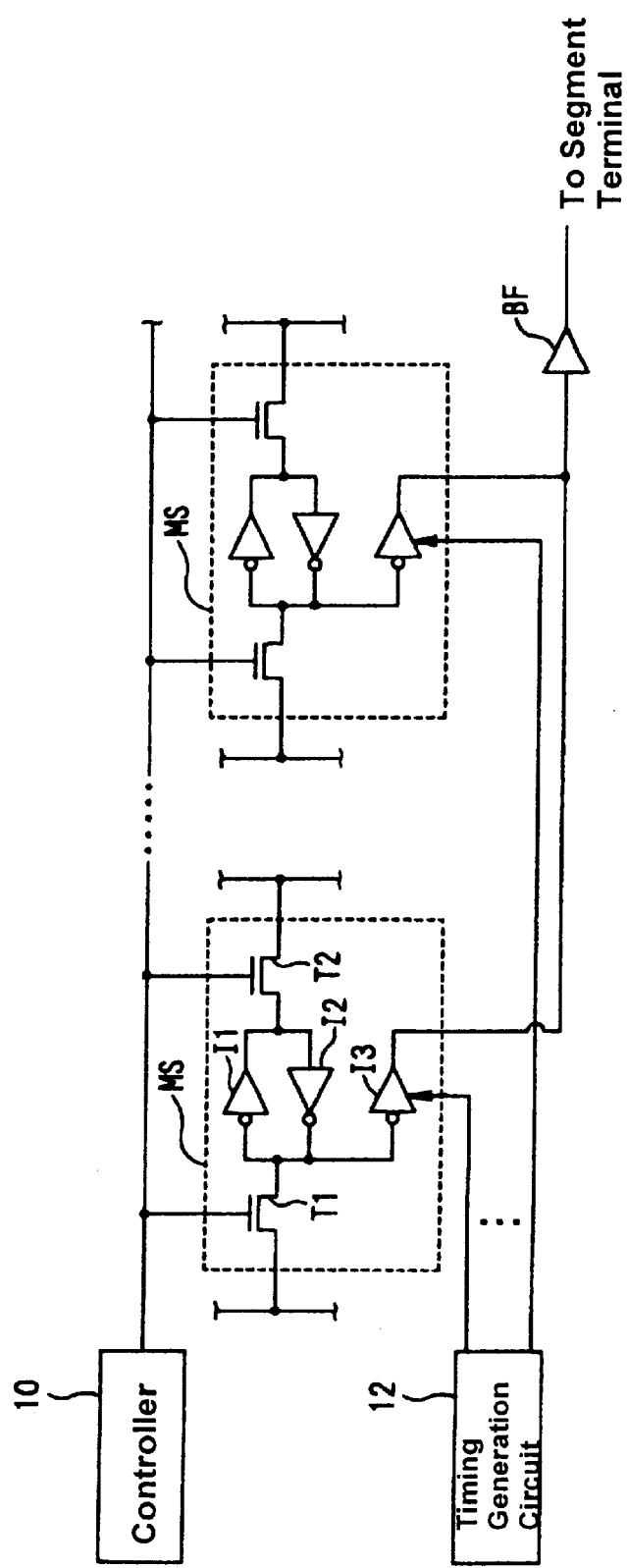
FIG. 6 schematically shows a structure of one example of a conventional display control apparatus.

FIG. 5 is a perspective view of a cellular phone 50 that is equipped with the cellular phone system shown in FIG. 4. The cellular phone 50 is formed from a main body section 60 that includes a keyboard 61, a liquid crystal display section 62, a receiver section 63 and an antenna section 64, and a lid section 70 that includes a transmission section 72.

As described above, in a display control apparatus in accordance with the present invention and an electronic appliance equipped with the display control apparatus, input data to the display apparatus terminal can be directly written in a memory region without passing the data through a bus. As a result, for example, when the display control apparatus is tested, the time for writing test data in a memory region can be shortened, and therefore, the overall processing time required for the test is shortened.

Also, data is inputted through one display apparatus terminal and written in a plurality of memory cells. Accordingly, by switching locations to write the data, the data can be inputted in the one display apparatus terminal and written in the plurality of memory cells.

Furthermore, a plurality of display apparatus terminals may be provided to enable writing data in memory regions in the unit of the number of the display apparatus terminals.

What is claimed is:

1. A display control apparatus comprising:

a storage region composed of a two-port memory having a first port and a second port;

a display apparatus terminal, display data being written in via the first port, and the display data is read out via the second port and outputted through the display apparatus terminal to a display apparatus, the display apparatus terminal switching between a state for data input and a state for data output; and a switch that mutually switches data-writing in the storage region through the second port and data-reading from the storage region through the second port data to be inputted in the display apparatus terminal being written in the storage region via the second port.

2. The display control apparatus according to claim 1, the storage region comprising a plurality of memory cells, data being written in each of the memory cells via the display apparatus terminal.

3. The display control apparatus according to claim 1, a plurality of display apparatus terminals being provided.

4. The display control apparatus according to claim 1, a display control apparatus being provided in an electronic appliance.

5. An electronic appliance equipped with the display control apparatus according to claim 1.

* * * * *